United States Patent
Tsai et al.

(10) Patent No.: US 12,400,863 B2
(45) Date of Patent: Aug. 26, 2025

(54) METHOD FOR ETCHING FOR SEMICONDUCTOR FABRICATION

(71) Applicant: Tokyo Electron Limited, Tokyo (JP)

(72) Inventors: Yu-Hao Tsai, Albany, NY (US); Du Zhang, Albany, NY (US); Mingmei Wang, Albany, NY (US); Takatoshi Orui, Taiwa-cho (JP); Motoi Takahashi, Taiwa-cho (JP); Masahiko Yokoi, Taiwa-cho (JP); Koki Tanaka, Taiwa-cho (JP); Yoshihide Kihara, Taiwa-cho (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 698 days.

(21) Appl. No.: 17/704,372

(22) Filed: Mar. 25, 2022

(65) Prior Publication Data

US 2023/0307242 A1 Sep. 28, 2023

(51) Int. Cl.
H01L 21/3065 (2006.01)

(52) U.S. Cl.
CPC .................. H01L 21/3065 (2013.01)

(58) Field of Classification Search
None
See application file for complete search history.

(56) References Cited

U.S. PATENT DOCUMENTS

| | | | |
|---|---|---|---|
| 3,867,218 A | 2/1975 | Henry | |
| 8,614,151 B2 * | 12/2013 | Benson | H01L 21/31116 438/720 |
| 10,861,693 B2 * | 12/2020 | Stone | H01L 21/02063 |
| 2004/0171211 A1 | 9/2004 | Lee et al. | |
| 2015/0214474 A1 | 7/2015 | Nishimura et al. | |
| 2016/0293609 A1 * | 10/2016 | Jha | H01L 21/31116 |
| 2019/0189462 A1 * | 6/2019 | Hudson | H01L 21/3065 |
| 2021/0143028 A1 | 5/2021 | Yokoyama et al. | |

OTHER PUBLICATIONS

International Search Report and Written Opinion, International Application No. PCT/US2023/016163 dated Jul. 17, 2023, 9 pages.

* cited by examiner

*Primary Examiner* — Stephanie P Duclair
(74) *Attorney, Agent, or Firm* — Slater Matsil, LLP (57) ABSTRACT

A method of processing a substrate includes patterning a mask over a dielectric layer and etching openings in the dielectric layer. The dielectric layer is disposed over the substrate. The etching includes flowing an etchant, a polar or H-containing gas, and a phosphorus-halide gas. The method may further include forming contacts by filling the openings with a conductive material.

20 Claims, 12 Drawing Sheets

202 — Patterning a mask over a dielectric layer

204 — Etching openings in the dielectric layer with an etchant, a polar gas, and a phosphorus halide gas 206 — Forming conductive features by filling the openings with a conductive material

METHOD FOR ETCHING FOR SEMICONDUCTOR FABRICATION

TECHNICAL FIELD

The present invention relates generally to a system and method of semiconductor fabrication, and, in particular embodiments, to a system and method for etching dielectric materials with phosphorus-halide gases.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using etching processes.

The semiconductor industry has repeatedly reduced the minimum feature sizes in semiconductor devices to a few nanometers to increase the packing density of components. Accordingly, the semiconductor industry increasingly demands etching technology to provide processes for patterning features with accuracy, precision, and profile control, often at atomic scale dimensions. Meeting this challenge along with the uniformity and repeatability needed for high volume IC manufacturing requires further innovations of etching technology.

SUMMARY

In accordance with an embodiment, a method of processing a substrate includes: patterning a mask over a dielectric layer, the dielectric layer disposed over the substrate; etching openings in the dielectric layer, the etching including flowing an etchant, a polar or H-containing gas, and a phosphorus-halide gas; and forming contacts by filling the openings with a conductive material.

In accordance with another embodiment, a method of processing a substrate includes: performing a cyclic etching process, where each cycle of the cyclic etching process includes: flowing an etchant over a dielectric layer on the substrate, the substrate being in a process chamber; forming a catalyst in the process chamber by flowing a polar or H-containing gas and a phosphorus-halide gas over the dielectric layer in the process chamber; and purging the catalyst from the process chamber.

In accordance with yet another embodiment, a method of processing a substrate in a process chamber, includes: flowing an etchant and a polar or H-containing gas over a dielectric layer including an exposed surface of the substrate; and performing a cyclic tuning process, where each cycle of the cyclic tuning process includes: adjusting a temperature of the process chamber; and flowing a phosphorus-halide gas over the dielectric layer.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-5 illustrate cross sectional views of a substrate during an example process of semiconductor fabrication including an etch process to form a high aspect ratio (HAR) feature on the substrate in accordance with various embodiments, wherein

Corresponding numerals and symbols in the different figures generally refer to corresponding parts unless otherwise indicated. The figures are drawn to illustrate clearly the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. More-over, particular conformations, structures, or characteristics may be combined in any adequate way in one or more embodiments.

The references used herein are provided merely for convenience and hence do not define the extent of protection or the scope of the embodiments. According to one or more embodiments of the present disclosure, this application relates to fabrication of semiconductor devices, for example, integrated circuits including semiconductor devices, and more particularly to high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio features (e.g., a contact hole) of a circuit element. Features with aspect ratio (ratio of height of the feature to the width of the feature) higher than 50:1 are generally considered to be high aspect ratio features, and in some cases fabricating a higher aspect ratio such as 100:1 may be desired for advanced 3D semiconductor devices. However, conventional high aspect ratio etch methods may usually include tens and sometimes hundreds of processing steps, which thereby complicates the process optimization and etch throughput. A simple yet effective high aspect ratio process may therefore be desired. Embodiments of the present application disclose methods of fabricating high aspect ratio features by etch processes based on a combination of etchants, polar or H-containing gases, and phosphorus-halide gases. The etch processes may be further applied to fabricating other semiconductor features that are not high aspect ratio features, e.g. with isotropic etch processes. The increased etch rate of the disclosed etch processes may enable faster production time and decreased costs.

The methods of etching described in this disclosure may overcome various challenges posed for etching processes for high aspect ratio features. In various embodiments, the etch processes using a combination of etchants, polar or H-containing gases, and phosphorus-halide gases provide increased etch rates that may be useful for anisotropic etching of high aspect ratio features. The disclosed etch processes may also be useful for achieving enhanced etch rates for isotropic etch processes on dielectric materials.

In the following, FIGS. 1 through 5 first illustrate an exemplary etch process to form a desired high aspect ratio feature in accordance with various embodiments. The effects of the etch chemistry on etch rates are described. Next, principles behind the etch chemistry are described in FIGS. 6A-6E. Example process flow diagrams are then illustrated in FIGS. 7, 8, and 9. FIG. 10 provides an example plasma system for performing a process of semiconductor fabrication in accordance with various embodiments. All figures are drawn for illustration purpose only and not to scale.

FIGS. 1 through 5 illustrate cross sectional views of a substrate 100 during an example process of semiconductor fabrication including an etch process to form a high aspect ratio feature on the substrate in accordance with various embodiments.

Figure 1:
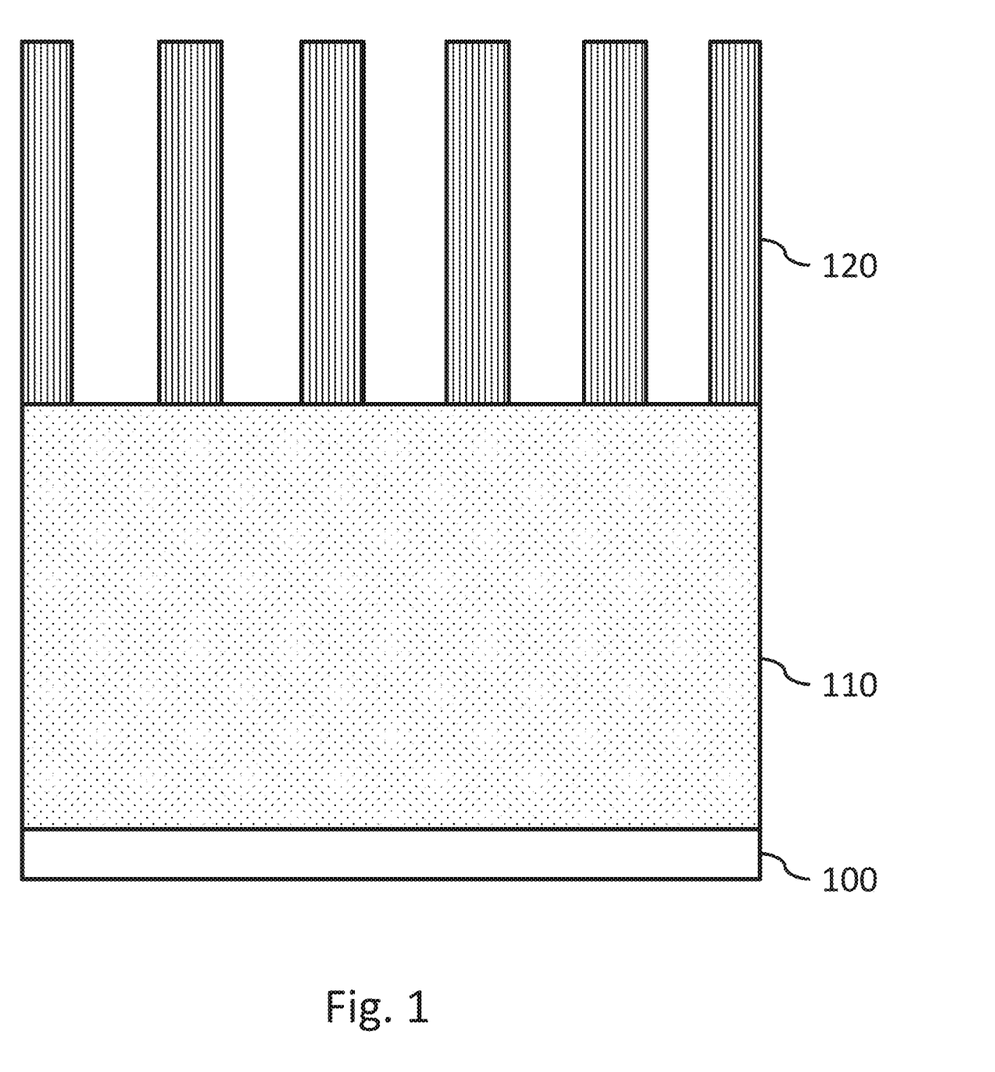
FIG. 1 illustrates an incoming substrate including a dielectric layer and a patterned hardmask layer.

FIG. 1 illustrates an incoming substrate 100 including a dielectric layer 110 and a patterned hardmask layer 120 (also referred to as a mask). In one or more embodiments, the substrate 100 may be a silicon wafer, or a silicon-on-insulator (SOI) wafer. In certain embodiments, the substrate may include a silicon germanium wafer, silicon carbide wafer, gallium arsenide wafer, gallium nitride wafer and other compound semiconductors. In other embodiments, the substrate includes heterogeneous layers such as silicon germanium on silicon, gallium nitride on silicon, silicon carbon on silicon, as well layers of silicon on a silicon or SOI substrate.

In various embodiments, the substrate 100 is a part of a semiconductor device, and may have undergone a number of steps of processing following, for example, a conventional process. For example, the semiconductor structure may include a substrate 100 in which various device regions are formed. At this stage, the substrate 100 may include isolation regions such as shallow trench isolation (STI) regions as well as other regions formed therein.

The dielectric layer 110 may be formed over the substrate 100. In various embodiments, the dielectric layer 110 is a target layer that is to be patterned into one or more high aspect ratio features. In certain embodiments, the high aspect ratio feature being etched into the dielectric layer 110 may be a contact hole, slit, or other suitable structures including a recess. In some embodiments, the dielectric layer 110 includes an oxide (e.g., silicon oxide), silicon nitride, silicon oxynitride, an O/N/O/N stack (stacked layers of oxide and nitride), or the like. The dielectric layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the dielectric layer 110 is an O/N/O/N stack and has a total thickness in a range of 1 µm to 10 µm with each layer of the stack having a thickness between 50 nm and 2.5 µm.

Still referring to FIG. 1, the patterned hardmask layer 120 is formed over the dielectric layer 110. In various embodiments, the patterned hardmask layer 120 may include amorphous carbon layer (ACL). The patterned hardmask layer 120 may be formed by first depositing a hardmask layer using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hardmask layer may then be patterned using a lithography process and an anisotropic etch process. The relative thicknesses of the patterned hardmask layer 120 and the dielectric layer 110 may have any suitable relationship. For example, the patterned hardmask layer 120 may be thicker than the dielectric layer 110, thinner than the dielectric layer 110, or the same thickness as the dielectric layer 110. In certain embodiments, the patterned hardmask layer 120 has a thickness in a range of 1 µm to 4 µm.

The patterned hardmask layer 120 and/or the dielectric layer 110 may be collectively considered as a part of the substrate 100. Further, the substrate 100 may also include other layers. For example, for the purpose of patterning the hardmask layer, a tri-layer structure including a photoresist layer, SiON layer, and optical planarization layer (OPL) may be present.

Figure 2:
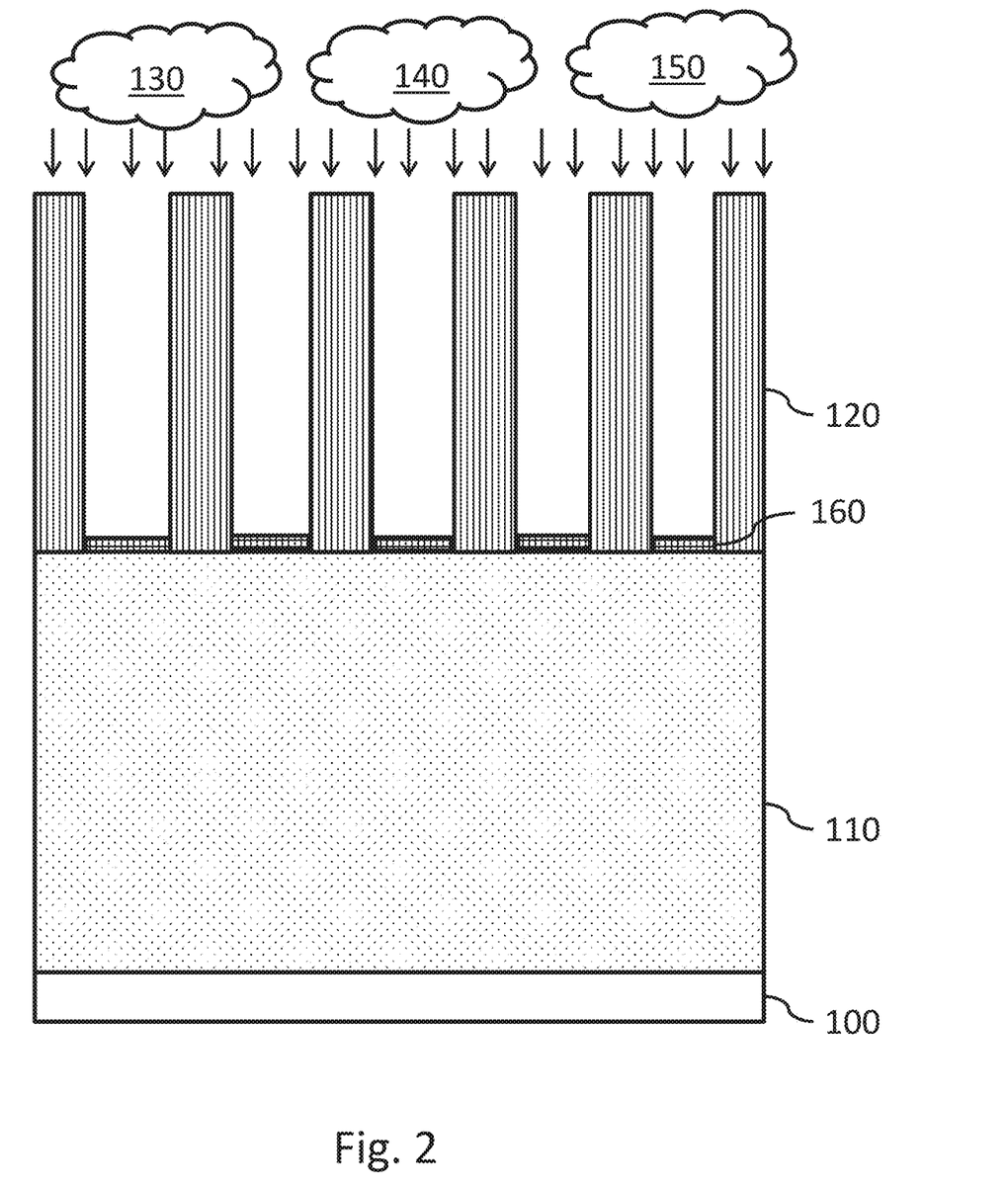
FIGS. 2-3 illustrate the substrate during the formation of the high aspect ratio feature by the etch process.

FIG. 2 illustrates the substrate 100 during a start of an etch process for the formation of one or more high aspect ratio features (e.g., contact plugs formed through dielectric layers or stacks for memory arrays). The etch process may be performed in a process chamber such as a plasma processing chamber 510 (see below, FIG. 10). However, any suitable process chamber may be used.

Fabricating the high aspect ratio features in the dielectric layer 110 is performed by an etch process using a combination of gases in accordance with various embodiments. Specifically, an etchant 130, a polar or H-containing gas 140, and a phosphorus-halide gas 150 are used. In order to achieve the high aspect ratio needed, it is advantageous for the etch process to have an increased etch rate. However, the geometry of the high aspect ratio openings formed may suppress the supply of etchant radicals at the etching interfaces on the bottom surfaces of the high aspect ratio openings. As such, the disclosed etch process may increase the concentration of etchant at the etching interfaces, leading to a faster etch rate.

The etchant 130 is a chemical suitable for etching dielectric material (e.g., the dielectric layer 110) that may be catalyzed by polar molecules retained on exposed surfaces of the dielectric layer 110. In various embodiments, the etchant 130 is hydrogen fluoride (HF), hydrogen chloride (HCl), the like, or a combination thereof. The polar or H-containing gas 140 is a gas that contains polar molecules or creates polar molecules on exposed surfaces of the dielectric layer 110. In various embodiments, the polar or H-containing gas 140 comprises water vapor ($H_2O$), hydrogen peroxide ($H_2O_2$), hydrogen ($H_2$), a mixture of hydrogen ($H_2$) and oxygen ($O_2$), hydrogen bromide (HBr), the like, or a combination thereof. However, any suitable polar gas or H-containing gas may be used. The phosphorus-halide gas 150 interacts with the polar molecules on exposed surfaces of the dielectric layer 110 to form a catalyst for the etchant 130. In various embodiments, the phosphorus-halide gas 150 is phosphorus trifluoride ($PF_3$), phosphorus trichloride ($PCl_3$), phosphoryl fluoride ($POF_3$), phosphoryl chloride ($POCl_3$), a phosphorus-containing gas with the formula $PX_x$ (where X represents H, F, Cl, Br, or a combination thereof), the like, or a combination thereof.

During the etching process, the polar or H-containing gas 140 interacts with the phosphorus-halide gas 150 to replace halogen atoms of the phosphorus-halide gas 150 with —OH groups to form a phosphorus-containing acid 160. This phosphorus-containing acid 160 acts as a co-adsorbate with polar molecules (e.g., water) and helps retain the etchant 130 on etch interfaces of the dielectric layer 110. The resulting higher density of the etchant 130 on the etch interfaces may advantageously increase the etch rate.

H-containing polar molecules, such as water, may also be retained on the etch interfaces of the dielectric layer 110, which may further catalyze the reaction of the etchant 130 with the dielectric layer 110. For example, when the etchant 130 is HF, the retained water on the etch interfaces of the dielectric layer 110 may react with the HF to produce hydrofluoric acid, thereby increasing the etch rate. The phosphorus-containing acid 160 may also further catalyze the reaction of the etchant 130 with the dielectric layer 110.

Figure 3:
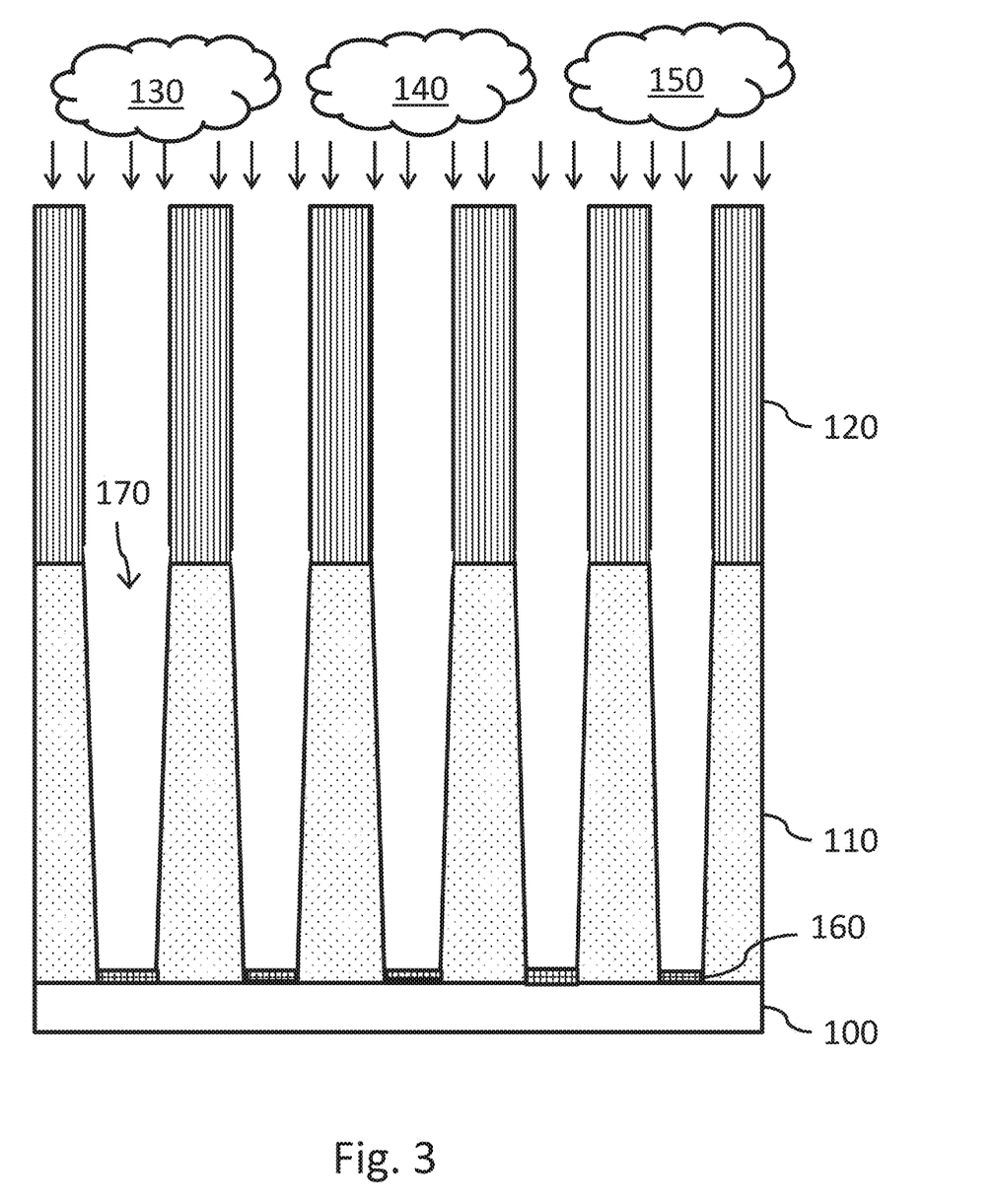

FIG. 3 illustrates the substrate 100 at a later stage of an etch process for the formation of one or more high aspect ratio features. Openings 170 with high aspect ratios extend into the dielectric layer 110. The illustrated etch process of FIG. 3 is anisotropic, so that the openings 170 are produced with high aspect ratios.

In some embodiments, the anisotropic etching is enabled by providing the etchant 130, the polar or H-containing gas 140, and the phosphorus-halide gas 150 with a plasma process that is performed in a suitable plasma processing system, such as described below with respect to FIG. 10. Due to the directed plasma bombardment, the phosphorus-containing acid 160 and polar molecules (e.g., water, hydroxyl, or the like) are formed to a greater degree on bottom surfaces of the openings 170 than on sidewalls of the openings 170. The high power of the plasma process may trigger reactions between the polar or H-containing gas 140 and oxygen or nitrogen atoms of the dielectric layer 110 to form polar molecules preferentially on the bottom surfaces of the openings 170. The polar molecules on the bottom surfaces of the openings 170 then interact with the phosphorus-halide gas 150 to form the phosphorus-containing acid 160 as a co-adsorbate on the bottom surfaces of the openings 170. The plasma process also supplies the etchant 130 to a greater degree on bottom surfaces of the openings 170 than on sidewalls of the openings 170. In addition, the greater amount of polar molecules on the bottom surfaces of the openings 170 help to further retain the etchant 130. This may cause the catalyzed reaction of the etchant 130 with the material of the dielectric layer 110 to be directed primarily towards the substrate 100, enabling anisotropic etching.

In some embodiments, isotropic etching is enabled without plasma processing by tuning flow rates of hydrocarbon gas and phosphorus-containing gases to facilitate adsorption of $H_2O$ and etchant 130 on the exposed surfaces of the openings 170. This may catalyze an isotropic etching process with the etchant 130 on exposed surfaces of the openings 170.

Also in the example of FIGS. 2-3, a sufficient etch rate enables the openings 170 to have a high aspect ratio in a short process time compared to conventional high aspect ratio etch methods. Simultaneously, due to a good selectivity to the patterned hardmask layer 120 during the etch process, only a small fraction of the patterned hardmask layer 120 may be consumed.

Figure 4:
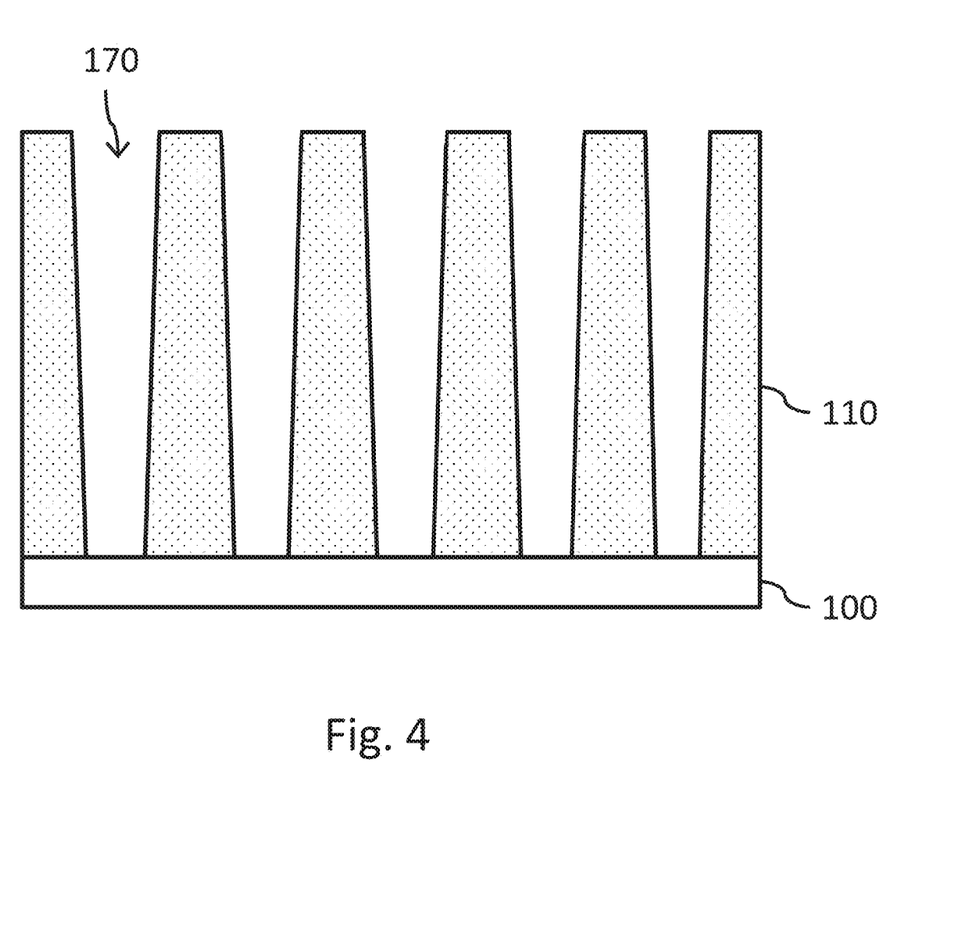
FIG. 4 illustrates the substrate after completing the etch process.

In FIG. 4, the patterned hardmask layer 120 is removed from over the dielectric layer 110 and residues from the etching process are removed. The patterned hardmask layer 120 may be removed with a suitable process, such as a planarization process (e.g., a CMP) or the like. In some embodiments, residues from the etching process are removed with a suitable cleaning process, such as a rinse with deionized water, hydrogen peroxide, $SC_{-1}$, the like, or a combination thereof.

Figure 5:
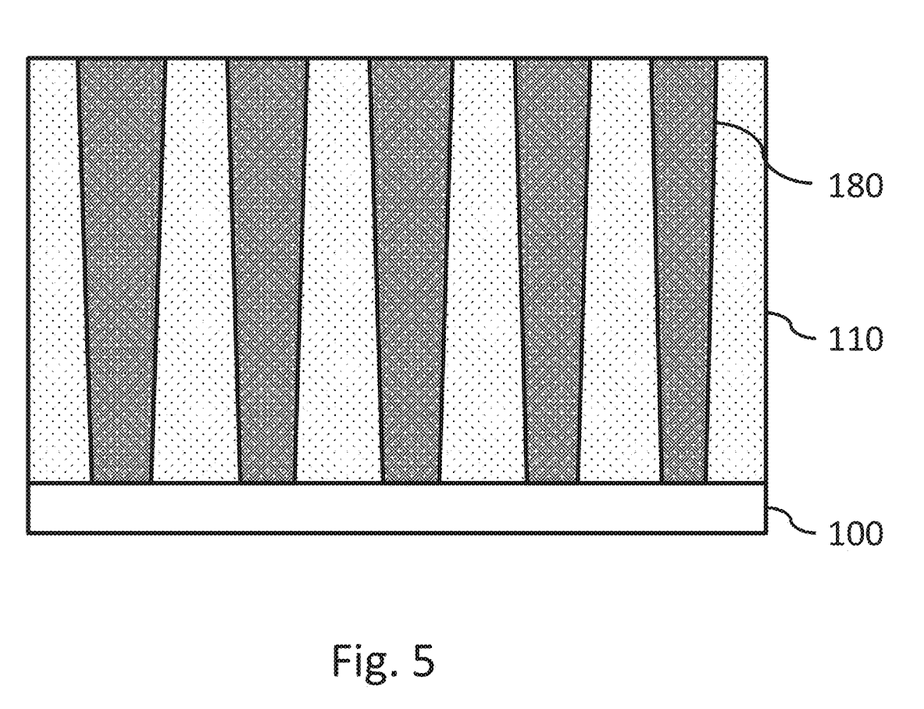
FIG. 5 illustrates the substrate after the high aspect ratio feature is formed.

In FIG. 5, conductive features 180 are formed in the openings 170 (see above, FIG. 4). In various embodiments, the conductive features 180 are high aspect ratio features. The conductive features 180 may be formed to physically and electrically couple with conductive portions of the substrate 100. As an example of forming the conductive features 180, a conformal barrier metal (e.g., TiN or TaN) liner is formed over the exposed surfaces of the dielectric layer 110 and the substrate 100. Next, the openings 170 are filled with a conductive material such as a metal. For example, the conductive material may be copper formed using electroplating. However, any suitable conductive material and deposition method may be used. Excess conductive material is then removed from the top surface of the dielectric layer 110 using a planarization process (e.g., a CMP), thereby forming the conductive features 180 inlaid in the dielectric layer 110.

Figure 6A:
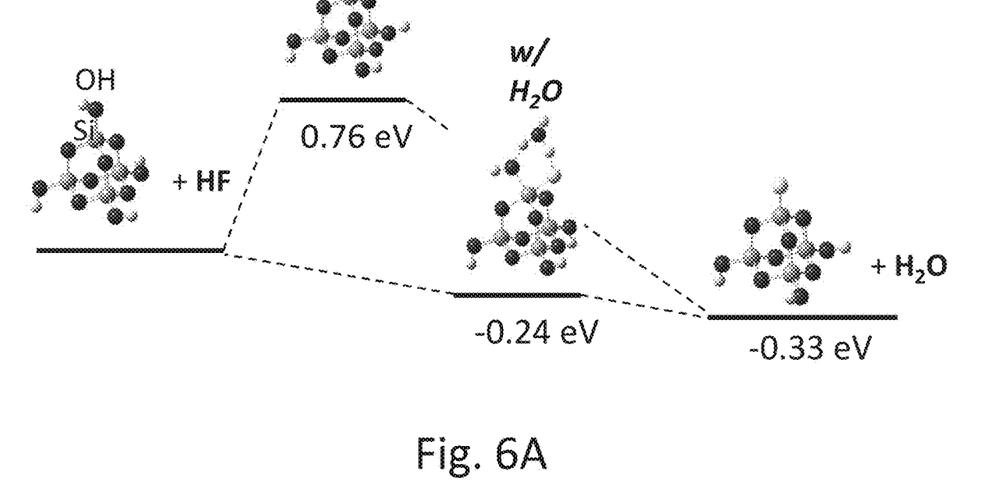
FIG. 6A illustrates a catalysation of oxide etching by the presence of water, in accordance with various embodiments.

FIG. 6A illustrates modelling of a catalysation of oxide etching by the presence of water, in accordance with various embodiments. The various surface energies and reaction barriers may be calculated with a suitable method such as density functional theory. On the left, an oxide molecular or atomic structure is illustrated. The oxide may include silicon atoms (e.g., the oxide may be a silicon oxide), and the oxide may have hydroxyl (OH) groups on its surface. An etchant HF may replace a hydroxyl group and the fluorine atom F may bond with a silicon atom, forming a SiF group. This process may break down the oxide and etch it away. However, the predicted reaction barrier of the chemical reaction of the HF with the oxide is 0.76 eV. If polar molecules (e.g., $H_2O$) are added and adhere to the surface of the oxide as shown in the lower center, the polar molecules may act as a catalyst for the reaction as the adhering of the H₂O to the oxide surface is favored (e.g., with an energy state lower than the initial state by 0.24 eV). A subsequent reaction of the oxide with adhered H₂O to form an etched oxide (e.g., having an SiF group) plus H₂O is further favored (e.g., with an energy state lower than the initial state by 0.33 eV). Although FIG. 6A illustrates an oxide as a dielectric material, HF as an etchant, and H₂O as a polar molecule as an example, the catalysation may be enabled with other dielectric materials (e.g., a nitride), etchants (e.g., HCl), or polar molecules or H-containing gases (e.g., HBr). As such, FIG. 6A illustrates that polar molecules may enable the increasing of etch rates of dielectric materials by reducing the reaction barrier energies.

Figure 6B:
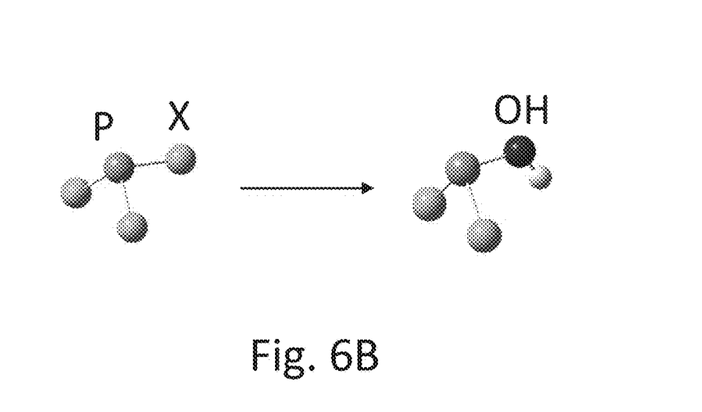
FIG. 6B illustrates a formation of an acid by the combination of a phosphorus-halide with a hydroxyl group, in accordance with various embodiments.

FIG. 6B illustrates a formation of an acid by the combination of a phosphorus-halide with a hydroxyl group, in accordance with various embodiments. For example, the phosphorus-halide may react with H₂O so that a hydroxyl (—OH) group replaces a halogen atom of the phosphorus-halide to form a phosphorus-containing acid. The reaction may be described by equation (1):

$$PX_n + Y—OH \rightarrow PX_{n-1}OH + Y—X \quad (1)$$

In equation (1) above, X represents a halogen atom (e.g., fluorine, chlorine, or the like) and Y represents an atom or atomic group attached to a hydroxyl (—OH) group. For an example where equation (1) represents a hydrolysis reaction in a system of the reactants $PX_n$ and Y—OH forming the products $PX_{n-1}OH$ and Y—X, Y is a hydrogen atom, Y—OH is a water (H₂O) molecule, $PX_{n-1}OH$ represents the phosphorus-containing acid, and Y—X represents the hydrogen atom attaching to one of the halogen atoms X. In the case of $PX_n$ being PF₃, the hydrolysis reaction may have a change of internal energy ΔE of the system of –0.1 eV. In the case of $PX_n$ being PCl₃, the hydrolysis reaction may have a change of internal energy ΔE of the system of –0.2 eV. In the case of $PX_n$ being POF₃, the hydrolysis reaction may have a change of internal energy ΔE of the system of –0.3 eV. In the case of $PX_n$ being POCl₃, the hydrolysis reaction may have a change of internal energy ΔE of the system of –0.33 eV. However, any suitable $PX_n$ gas may react with a polar or H-containing gas to form a phosphorus-containing acid.

Figure 6C:
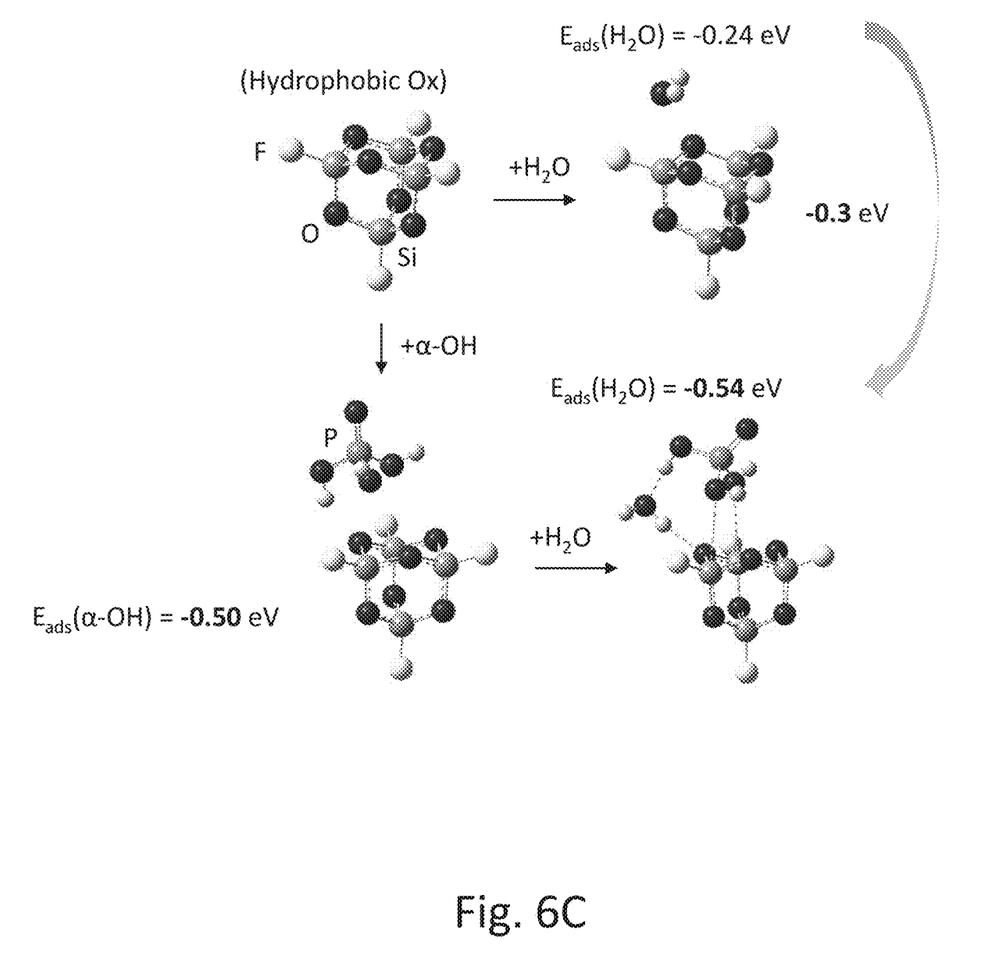
FIG. 6C illustrates an increase of surface water retention by the presence of acid molecules, in accordance with various embodiments.

FIG. 6C illustrates modelling data of an increase of surface water retention by the presence of acid molecules, in accordance with various embodiments. An oxide (e.g., silicon oxide) atomic structure with a bonded fluorine atom is shown at the top left, such as may be produced during an etch process of an oxide with HF. The surface of the oxide may be relatively hydrophobic due to the presence of the fluorine atom. On the top right, an adsorption reaction of the oxide with water is shown. The adsorption energy $E_{ads}(H_2O)$ of the water with the oxide surface may be –0.24 eV.

As further illustrated by FIG. 6C, the adsorption of water on the oxide surface may be catalyzed by a co-adsorption of a phosphorus-containing acid. On the bottom left, an adsorption reaction of the phosphorus-containing acid molecule (α-OH, where α contains phosphorus) with the oxide is shown. The adsorption energy $E_{ads}(H_2O)$ of the water with the oxide surface may be –0.50 eV. A further adsorption reaction of the oxide having phosphorus-containing acid with water is shown on the lower right, for which the adsorption energy $E_{ads}(H_2O)$ is –0.54 eV. This is a decrease of –0.3 eV from the adsorption energy $E_{ads}(H_2O)$ without co-adsorbed phosphorus-containing acid, for a total adsorption energy that is more than two times greater. This increased adsorption energy with the co-adsorbed phosphorus-containing acid may increase the concentration of water (or other polar molecules) adsorbed on the surface of the oxide, which increases the catalysation of the etch reaction and broadens the operational condition of the etch process. The increased adsorption of water by the co-adsorption reaction with the phosphorus-containing acid may also lower the water vapor pressure, which can increase the operation temperature region of the catalyzed etch process.

Figure 6D:
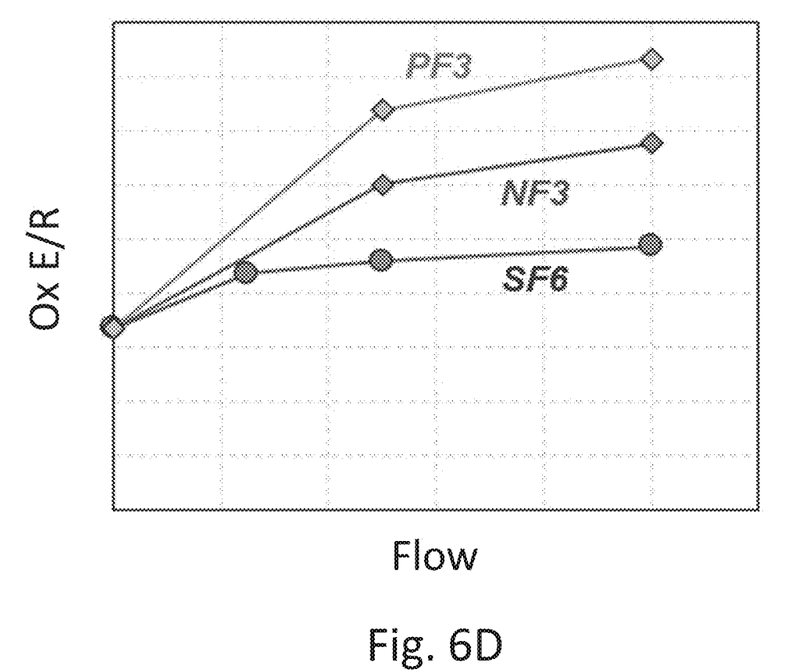
FIG. 6D illustrates achieved etch rates versus flow rates for different fluorine-containing gases, in accordance with various embodiments.

FIG. 6D illustrates experimental results of achieved etch rates versus flow rates for different fluorine-containing gases, in accordance with various embodiments. The x-axis shows the relative flow rates of different fluorine-containing gases PF₃, NF₃, and SF₆ that are flowed during respective etch process on an oxide (e.g., an etch process of silicon oxide with HF), and the y-axis shows the relative etch rates of the respective etch processes on an oxide (Ox E/R). As shown in FIG. 6D, the relative etch rate increases the most in proportion to increased flow rate for the phosphorus-containing PF₃ over the non-phosphorus-containing NF₃ and SF₆. This greater increase in etch rate using PF₃ occurs even though the NF₃ and SF₆ provide as much or more fluorine as the PF₃. This suggests that the greater increase in etch rate observed by flowing PF₃ may be due to the presence of phosphorus, which may be catalyzing the etch process by the mechanism describes above with respect to FIGS. 2 and 6C.

Figure 6E:
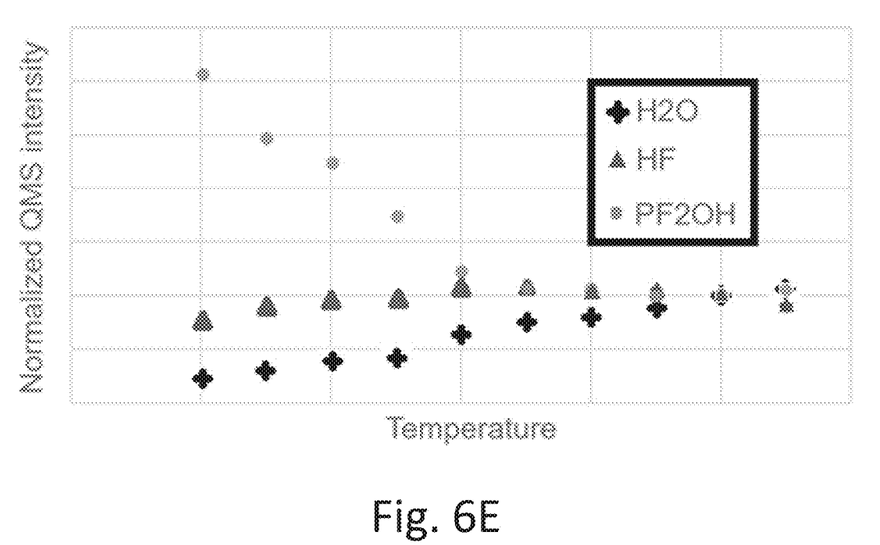
FIG. 6E illustrates quadrupole mass spectrometer (QMS) intensities versus temperature for $H_2O$, HF, and $PF_2OH$, in accordance with various embodiments.

FIG. 6E illustrates experimentally measured normalized quadrupole mass spectrometer (QMS) intensities versus temperature for HF, H₂O, and PF₂OH during an etch process performed by flowing HF, H₂O, and PF₃ over an oxide (e.g., silicon oxide), in accordance with various embodiments. The normalized QMS intensities of HF and H₂O decrease as temperature is decreased, indicating an increased adsorption of HF and H₂O on the oxide surface. Additionally, the normalized QMS intensity of PF₂OH increases as temperature is decreased, implying that the greater amount of PF₂OH is due to a greater amount of hydrolysis reactions near the surface of the oxide from an increase in the amount of adsorbed H₂O. This further suggests that the increase in etch rate observed by including PF₃ in FIG. 6D may be due to the co-adsorbate formation of PF₂OH catalyzing the adsorption of water and the etch reaction of HF being further catalyzed by the adsorbed water.

Figure 7:
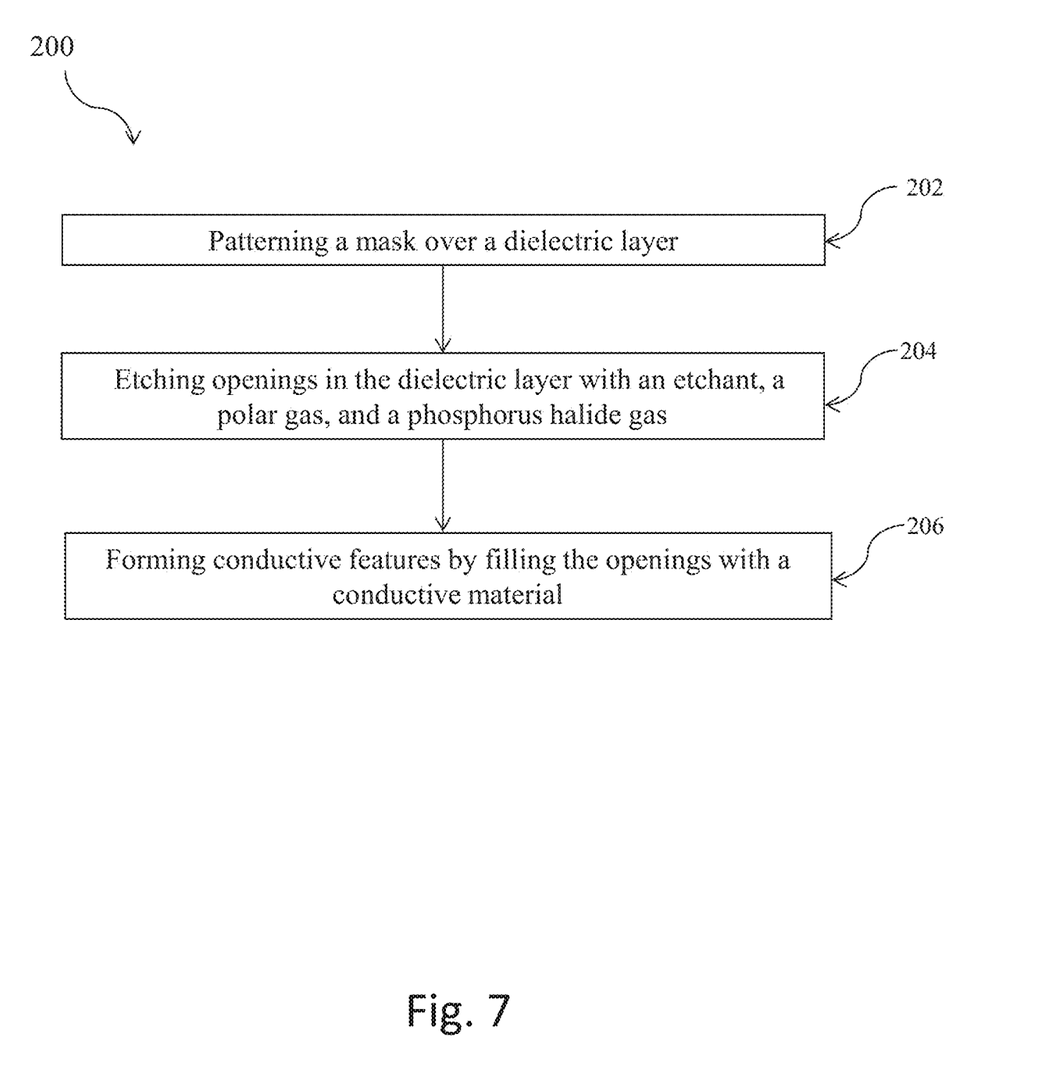
FIG. 7 illustrates a process flow chart diagram of a method for etch processing in accordance with various embodiments.

FIG. 7 illustrates a process flow chart diagram of a method 200 for continuous catalytic etch processing, in accordance with some embodiments. In step 202, a mask (e.g., a patterned hardmask layer 120) is patterned over a dielectric layer 110, as described above with respect to FIG. 1.

In step 204, openings 170 are etched in the dielectric layer 110 by flowing an etchant 130, a polar or H-containing gas 140, and a phosphorus-halide gas 150, as described above with respect to FIGS. 2-3. The etch process is a continuous catalytic etching in which the etchant 130, the polar or H-containing gas 140, and the phosphorus-halide gas 150 are flowed continuously into the process chamber containing the dielectric layer 110. The polar or H-containing gas 140 interacts with the phosphorus-halide gas 150 to replace halogen atoms of the phosphorus-halide gas 150 with —OH groups to form a phosphorus-containing acid 160. This phosphorus-containing acid 160 acts as a co-adsorbate and helps retain polar molecules (e.g., water, hydroxyl, or the like) with the etchant 130 on etch interfaces of the dielectric layer 110. The resulting higher density of the etchant 130 and polar molecules (e.g., water, hydroxyl, or the like) on the etch interfaces may catalyze the etch process and increase the etch rate.

In some embodiments, the continuous catalytic etching is an anisotropic plasma etch performed with a plasma processing system (see below, FIG. 10). In some embodiments, the continuous catalytic etching is an isotropic etch. The isotropic etch may be performed by tuning flow rates of hydrocarbon gas and phosphorus-containing gases to facilitate adsorption of $H_2O$ and etchants 130 on the exposed surfaces of the openings 170, thereby catalyzing the isotropic etching process.

In one embodiment of a continuous catalytic plasma etching, a flow rate of the etchant 130 (e.g., HF, HCl, or the like) is in a range of 1 sccm to 1000 sccm, a flow rate of the polar or H-containing gas 140 (e.g., $H_2O$, HBr, or the like) is in a range of 1 sccm to 1000 sccm, a flow rate of the phosphorus-halide gas 150 is in a range of 1 sccm to 1000 sccm. The continuous catalytic plasma etching is performed at a temperature in a range of −200° C. to 250° C. and at a pressure in a range of 0.1 mTorr to 1000 mTorr. The continuous catalytic plasma etching is performed with a plasma power in a range of 50 W to 15000 W.

In step 206, conductive features 180 (e.g., contact plugs for memory arrays) are formed by filling the openings 170 with a conductive material, as described above with respect to FIG. 5. The conductive features 180 may be high aspect ratio features, such as with aspect ratios greater than 50:1.

Figure 8:
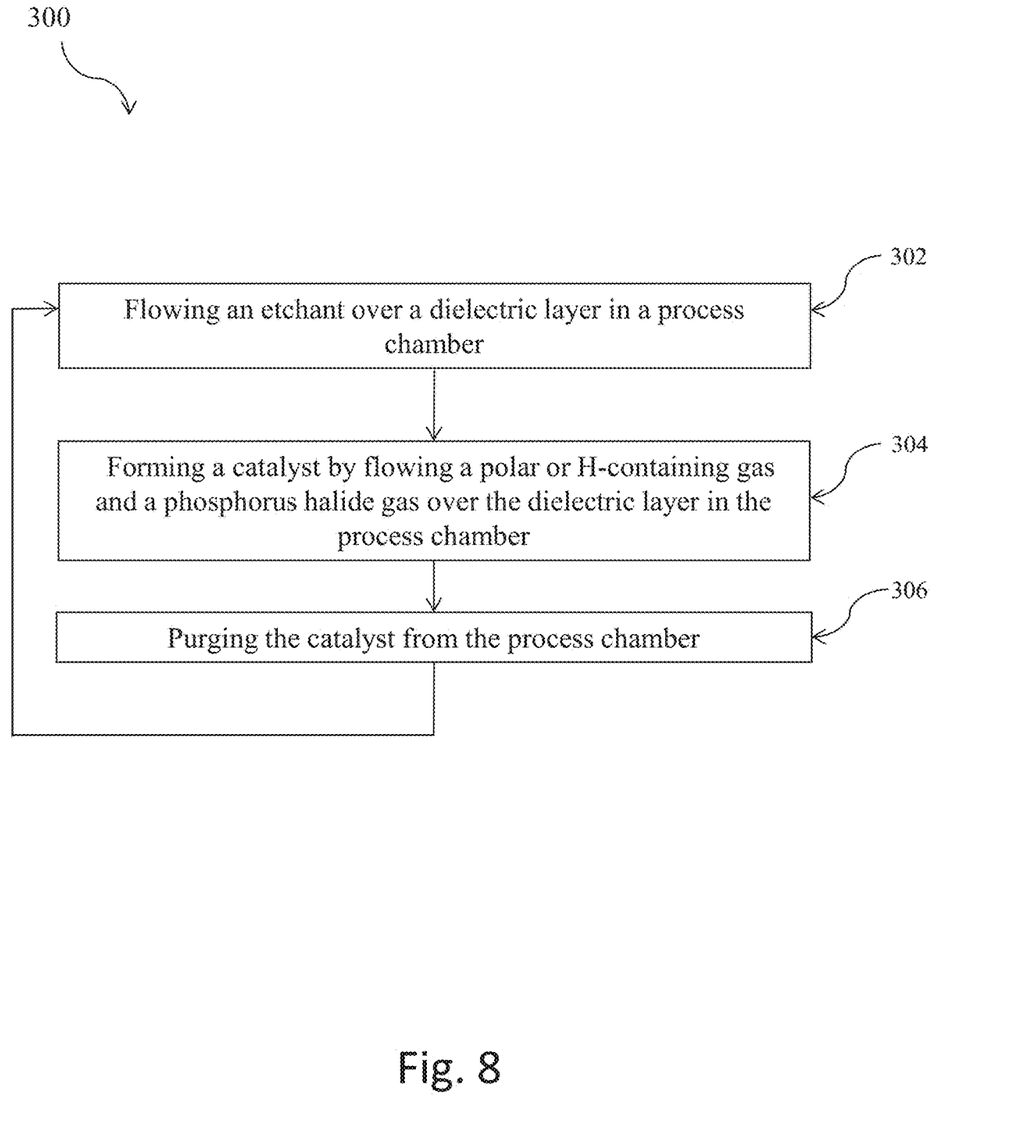
FIG. 8 illustrates a process flow chart diagram of a method for etch processing in accordance with various embodiments.

FIG. 8 illustrates a process flow chart diagram of a method 300 for quasi-atomic layer catalytic etch processing, in accordance with some embodiments. The quasi-atomic layer catalytic etch processing may increase controllability of the etch process, such as to increase the anisotropy of the formed openings 170 (see FIG. 3) or to control the etching depth.

In step 302, an etchant 130 (e.g., HF, HCl, or the like) is flowed over a dielectric layer 110 in a process chamber. In an embodiment, a flow rate of the etchant 130 is in a range of 1 sccm to 1000 sccm. The etchant 130 is flowed for a duration in a range of 1 second to 300 seconds, at a temperature in a range of −200° C. to 50° C. and at a pressure in a range of 0.1 mTorr to 1000 mTorr. A small amount of etchant 130 (e.g., a monolayer or a bilayer) is formed on the exposed surfaces of the dielectric layer 110.

In step 304, a catalyst for the etch process is formed by flowing a polar or H-containing gas 140 (e.g., $H_2O$, HBr, or the like) and a phosphorus-halide gas 150 into the process chamber containing the dielectric layer 110. The phosphorus-halide gas 150 interacts with the polar or H-containing gas 140 to form a catalyst, such as a phosphorus-containing acid 160 (see above, FIGS. 2-3) and polar molecules on etch interfaces of the dielectric layer 110. This catalyzes the etch process and increases the etch rate, as described above with respect to FIGS. 2-3. The etch process consumes the small amount of the etchant on the exposed surfaces of the dielectric layer 110, leaving the catalyst behind, such as the phosphorus-containing acid 160 and polar molecules.

In some embodiments, forming the catalyst includes a flow rate of the polar or H-containing gas 140 in a range of 1 sccm to 1000 sccm and a flow rate of the phosphorus-halide gas 150 in a range of 0.1 sccm to 1000 sccm. The polar or H-containing gas 140 and the phosphorus-halide gas 150 are flowed for a duration in a range of 1 second to 300 seconds, at a temperature in a range of −200° C. to 250° C. and at a pressure in a range of 0.1 mTorr to 1000 mTorr.

In step 306, the process chamber is purged to remove the remaining catalyst, such as phosphorus-containing acid 160 and polar molecules. Any remaining etchant 130 may also be purged. The purge may be performed by flowing an inert gas (e.g., argon or the like) into the process chamber, by evacuating the process chamber with a vacuum pump, or a combination thereof. Removing the catalyst with the purge may increase the controllability of subsequent steps of the quasi-atomic layer catalytic etch process, e.g. so that a desired amount of the dielectric layer 110 is etched with each step and a desired shape of the formed openings 170 (see above, FIG. 3) is achieved.

Steps 302 through 306 may be repeated for any suitable number of cycles in order to etch the dielectric layer 110 to a desired depth. In some embodiments, the quasi-atomic layer catalytic etch processing includes 1 cycle to 1000 cycles of steps 302 through 306.

Figure 9:
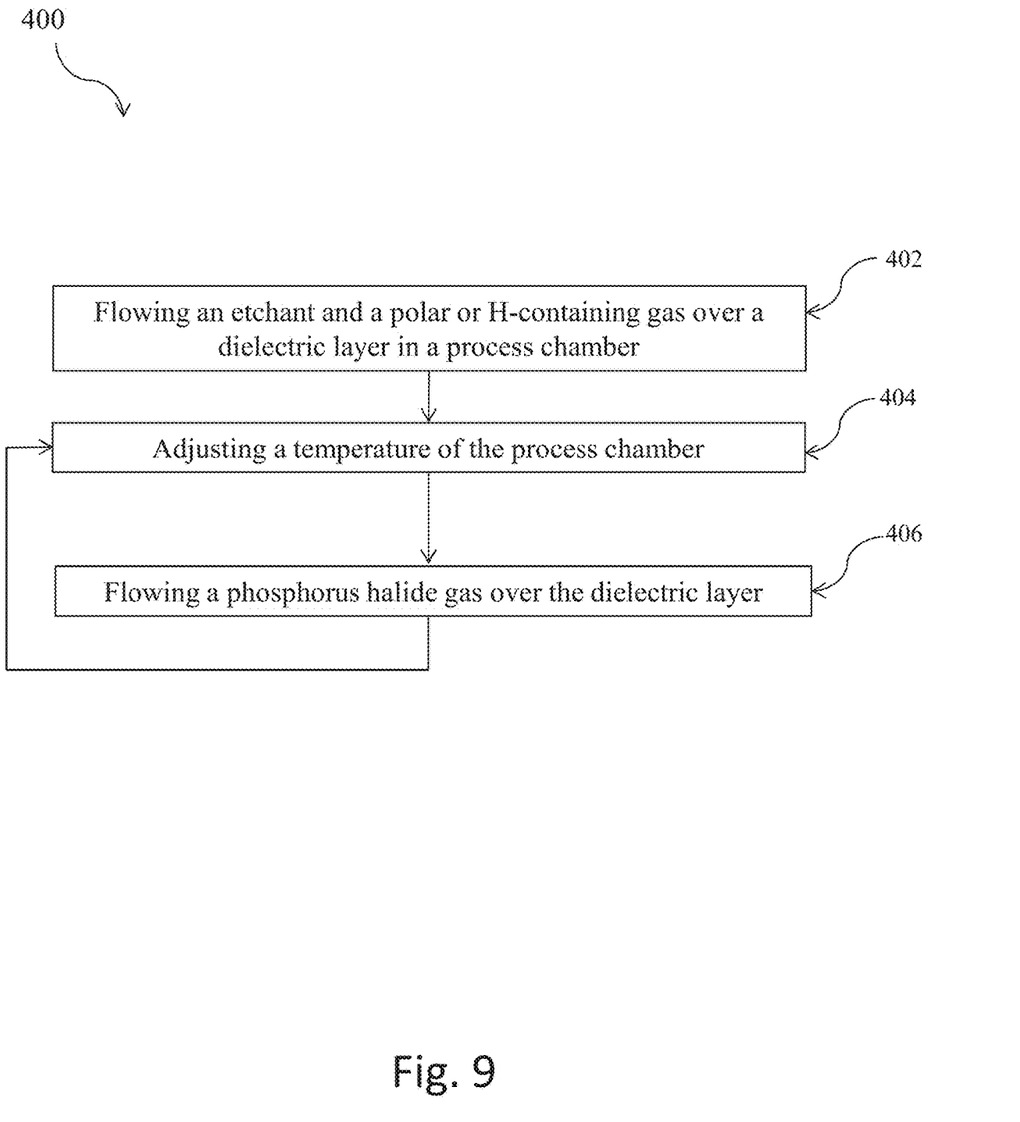
FIG. 9 illustrates a process flow chart diagram of a method for etch processing in accordance with various embodiments.
Figure 10:
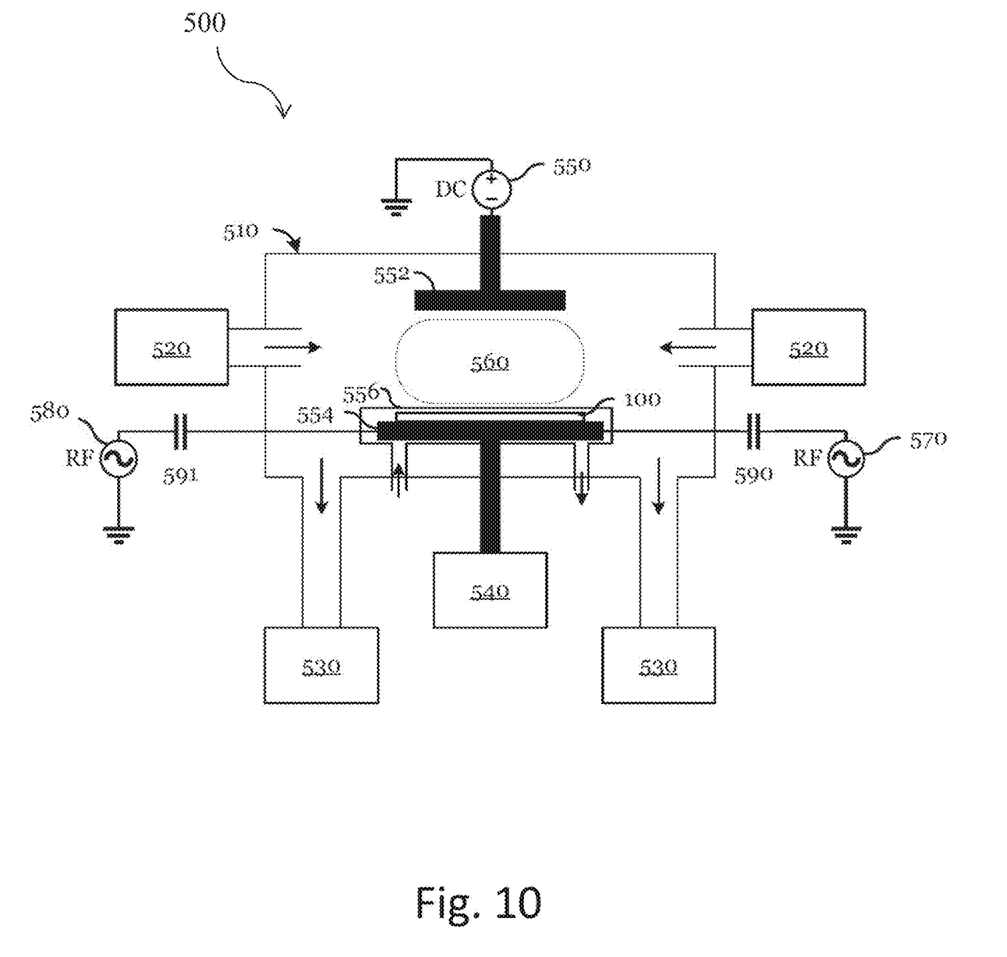
FIG. 10 illustrates a plasma system for performing a process of semiconductor fabrication in accordance with various embodiments.

FIG. 9 illustrates a process flow chart diagram of a method 400 for an etch processing method with temperature tuning, in accordance with some embodiments. Tuning the temperature may decouple the temperature and etch rate so that a desired etch rate may be achieved.

In step 402, an etchant 130 (e.g., HF or HCl) and a polar or H-containing gas 140 (e.g., $H_2O$, $H_2O_2$, $H_2$, HBr, the like, or a combination thereof) are flowed over a dielectric layer 110 in a process chamber. In an embodiment, a flow rate of the etchant 130 is in a range of 1 sccm to 1000 sccm, and a flow rate of the polar or H-containing gas 140 is in a range of 1 sccm to 1000 sccm. The etchant 130 and the polar or H-containing gas 140 are flowed for a duration in a range of 1 second to 300 seconds and at a pressure in a range of 1 mTorr to 1000 mTorr. The temperature in the process chamber in step 402 is in a range of −200° C. to 250° C., which is useful for controlling the amount of polar or H-containing gas 140 retained on the surface of the dielectric layer 110. For example, lower temperatures may increase the amount of polar or H-containing gas 140 retained on the surface of the dielectric layer 110, which is advantageous for increasing the etch rate.

In step 404, the temperature of the process chamber is adjusted in order to provide a desired etch rate. In some embodiments, the initial process temperature in the first cycle of the method 400 is in a range of −200° C. to 250° C. In subsequent cycles, the temperature may be tuned upwards or downwards as suitable to change the etch rate.

In step 406, a phosphorus-halide gas 150 is flowed into the process chamber. The phosphorus-halide gas 150 interacts with the polar or H-containing gas to form a catalyst, such as a phosphorus-containing acid 160 (see above, FIGS. 2-3) and polar molecules, on etch interfaces of the dielectric layer 110. This catalyzes the etch process and increases the etch rate, as described above with respect to FIGS. 2-3. The interaction of the phosphorus-halide gas 150 interacts with the polar or H-containing gas and the subsequent catalysis of the reaction of the etchant 130 with the dielectric layer 110 may be controlled by the temperature of the process temperature set in step 404.

In an embodiment, the phosphorus-halide gas 150 is flowed into the process chamber with a flow rate in a range of 1 sccm to 1000 sccm, for a duration in a range of 1 second to 300 seconds, at a pressure in a range of 0.1 mTorr to 1000 mTorr. The flow rate of the phosphorus-halide gas 150 may be increased or decreased in each repeated step 406 to achieve a desired etch rate.

Steps 404 and 406 may be repeated for any suitable number of cycles in order to etch the dielectric layer 110 to a desired depth. In some embodiments, the processing includes 1 cycle to 1000 cycles of steps 404 and 406. The temperature of the process chamber may be tuned in each step 404 to achieve a desired etch rate in step 406.

FIG. 10 illustrates a plasma processing system 500 for performing a process of semiconductor fabrication in accordance with various embodiments. For illustrative purposes, FIG. 10 illustrates a substrate 100 placed on a substrate holder 554 (e.g., a circular electrostatic chuck (ESC)) inside a plasma processing chamber 510 near the bottom. The substrate 100 may be optionally maintained at a desired temperature using a heater/cooler 556 that surrounds the substrate holder 554. The temperature of the substrate 100 may be maintained by a temperature controller 540 connected to the substrate holder 554 and the heater/cooler 556. The ESC may be coated with a conductive material (e.g., a carbon-based or metal-nitride based coating) so that electrical connections may be made to the substrate holder 554.

As illustrated in FIG. 10, the substrate holder 554 may be a bottom electrode of the plasma processing chamber 510. In the illustrative example in FIG. 5, the substrate holder 554 is connected to two RF-bias power sources, 570 and 580 through blocking capacitors 590 and 591. In some embodiment, a conductive circular plate inside the plasma processing chamber 510 near the top is the top electrode 552. In FIG. 5, the top electrode 552 is connected to a DC power source 550 of the plasma processing system 500.

The gases may be introduced into the plasma processing chamber 510 by a gas delivery system 520. The gas delivery system 520 includes multiple gas flow controllers to control the flow of multiple gases into the chamber. Each of the gas flow controllers of the gas delivery system 520 may be assigned for each of etchants 130, polar or H-containing gases 140, and/or phosphorus-halide gases 150 (see above, FIGS. 2-3). In some embodiments, optional center/edge splitters may be used to independently adjust the gas flow rates at the center and edge of the substrate 100.

The RF-bias power sources 570 and 580 may be used to supply continuous wave (CW) or pulsed RF power to sustain the plasma, such as a plasma 560. The plasma 560, shown between the top electrode 552 and the bottom electrode (also the substrate holder 554), exemplifies direct plasma generated close to the substrate 100 in the plasma processing chamber 510 of the plasma processing system 500. The plasma 560 may include ions from the etchants 130, polar or H-containing gases 140, and/or phosphorus-halide gases 150. Etching may be performed by exposing the substrate 100 to the plasma 560 while powering the substrate holder 554 with RF-bias power sources 570, 580 and optionally the top electrode 552 with the DC power source 550. The etching process performed may be an etching of high aspect ratio features as illustrated above in FIGS. 2-3, using the method 200 (see above, FIG. 7), the method 300 (see above, FIG. 8), the method 400 (see above, FIG. 9), the like, or a combination thereof.

The configuration of the plasma processing system 500 described above is by example only. In alternative embodiments, various alternative configurations may be used for the plasma processing system 500. For example, inductively coupled plasma (ICP) may be used with RF source power coupled to a planar coil over a top dielectric cover, the gas inlet and/or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 500 may be a resonator such as a helical resonator.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the disclosure are summarized here. Other embodiments can also be understood from the entirety of the specification as well as the claims filed herein.

Example 1. A method of processing a substrate, the method including: patterning a mask over a dielectric layer, the dielectric layer disposed over the substrate; etching openings in the dielectric layer, the etching including flowing an etchant, a polar or H-containing gas, and a phosphorus-halide gas; and forming contacts by filling the openings with a conductive material.

Example 2. The method of example 1, where the etchant is HF or HCl.

Example 3. The method of example 1, where the polar or H-containing gas includes water vapor ($H_2O$), hydrogen peroxide ($H_2O_2$), hydrogen ($H_2$), a mixture of hydrogen ($H_2$) and oxygen ($O_2$), or hydrogen bromide (HBr).

Example 4. The method of example 1, where the phosphorus-halide gas includes phosphorus trifluoride ($PF_3$), phosphorus trichloride ($PCl_3$), phosphoryl fluoride ($POF_3$), or phosphoryl chloride ($POCl_3$).

Example 5. The method of example 1, where the dielectric layer includes silicon oxide or silicon nitride.

Example 6. The method of example 5, where the dielectric layer includes an O/N/O/N stack.

Example 7. The method of example 1, where the etching anisotropically etches the openings in an anisotropic etch process.

Example 8. The method of example 7, where the anisotropic etch process is performed as a plasma process in a plasma processing system.

Example 9. The method of example 1, where the contacts have respective aspect ratios greater than 50:1.

Example 10. A method of processing a substrate, the method including: performing a cyclic etching process, where each cycle of the cyclic etching process includes: flowing an etchant over a dielectric layer on the substrate, the substrate being in a process chamber; forming a catalyst in the process chamber by flowing a polar or H-containing gas and a phosphorus-halide gas over the dielectric layer in the process chamber; and purging the catalyst from the process chamber.

Example 11. The method of example 10, where the etchant is HF.

Example 12. The method of example 10, where the phosphorus-halide gas is phosphorus trifluoride ($PF_3$).

Example 13. The method of example 10, where the catalyst includes $PF_2OH$.

Example 14. The method of example 10, where the etching process is a plasma process.

Example 15. The method of example 10, where the etching process is anisotropic.

Example 16. A method of processing a substrate in a process chamber, the method including: flowing an etchant and a polar or H-containing gas over a dielectric layer including an exposed surface of the substrate; and performing a cyclic tuning process, where each cycle of the cyclic tuning process includes: adjusting a temperature of the process chamber; and flowing a phosphorus-halide gas over the dielectric layer.

Example 17. The method of example 16, where the polar or H-containing gas includes $H_2O$.

Example 18. The method of example 16, where the phosphorus-halide gas includes phosphorus and fluorine.

Example 19. The method of example 16, where the dielectric layer includes silicon oxide.

Example 20. The method of example 16, further including forming an opening in the dielectric layer, the opening having an aspect ratio greater than 50:1.

While this invention has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of processing a substrate, the method comprising:
    patterning a mask over a dielectric layer, the dielectric layer disposed over the substrate;
    etching openings in the dielectric layer, the etching comprising:
        flowing an etchant, a polar or H-containing gas, and a phosphorus-halide gas; and
        forming a catalyst comprising a phosphorus-containing acid; and
    forming contacts by filling the openings with a conductive material.

2. The method of claim 1, wherein the etchant is HF or HCl.

3. The method of claim 1, wherein the polar or H-containing gas comprises water vapor ($H_2O$), hydrogen peroxide ($H_2O_2$), hydrogen ($H_2$), a mixture of hydrogen ($H_2$) and oxygen ($O_2$), or hydrogen bromide (HBr).

4. The method of claim 1, wherein the phosphorus-halide gas comprises phosphorus trifluoride ($PF_3$), phosphorus trichloride ($PCl_3$), phosphoryl fluoride ($POF_3$), or phosphoryl chloride ($POCl_3$).

5. The method of claim 1, wherein the dielectric layer comprises silicon oxide or silicon nitride.

6. The method of claim 5, wherein the dielectric layer comprises an O/N/O/N stack.

7. The method of claim 1, wherein the etching anisotropically etches the openings in an anisotropic etch process.

8. The method of claim 7, wherein the anisotropic etch process is performed as a plasma process in a plasma processing system.

9. The method of claim 1, wherein the contacts have respective aspect ratios greater than 50:1.

10. A method of processing a substrate, the method comprising:
    performing a cyclic etching process, wherein each cycle of the cyclic etching process comprises:
        flowing an etchant over a dielectric layer on the substrate, the substrate being in a process chamber;
        forming a catalyst in the process chamber by simultaneously flowing a polar or H-containing gas and a phosphorus-halide gas over the dielectric layer in the process chamber; and
        purging the catalyst from the process chamber.

11. The method of claim 10, wherein the etchant is HF.

12. The method of claim 10, wherein the phosphorus-halide gas is phosphorus trifluoride ($PF_3$).

13. The method of claim 10, wherein the catalyst comprises $PF_2OH$.

14. The method of claim 10, wherein the cyclic etching process is a plasma process.

15. The method of claim 10, wherein the cyclic etching process is anisotropic.

16. A method of processing a substrate in a process chamber, the method comprising:
    simultaneously flowing an etchant and a polar or H-containing gas over a dielectric layer comprising an exposed surface of the substrate; and
    performing a cyclic tuning process, wherein each cycle of the cyclic tuning process comprises:
        adjusting a temperature of the process chamber; and
        flowing a phosphorus-halide gas over the dielectric layer.

17. The method of claim 16, wherein the polar or H-containing gas comprises $H_2O$.

18. The method of claim 16, wherein the phosphorus-halide gas comprises phosphorus and fluorine.

19. The method of claim 16, wherein the dielectric layer comprises silicon oxide.

20. The method of claim 16, further comprising forming an opening in the dielectric layer, the opening having an aspect ratio greater than 50:1.

* * * * *